United States Patent [19]

Sato

[11] 4,059,445

[45] Nov. 22, 1977

[54] NOBLE METAL IMAGE FORMING METHOD

[75] Inventor: Masamichi Sato, Asaka, Japan

[73] Assignee: Fuji Photo Film Co., Ltd., Minami-ashigara, Japan

[21] Appl. No.: 600,246

[22] Filed: July 30, 1975

[30] Foreign Application Priority Data

Aug. 1, 1974 Japan .................. 49-88419

[51] Int. Cl.$^2$ .................. G03C 5/00; G03C 7/00; G03C 5/04; G03C 5/26

[52] U.S. Cl. .................. 96/35; 96/36.2; 96/50 R; 96/58; 96/27 H

[58] Field of Search ............ 96/48 PD, 35, 60, 34, 96/27 H, 36.2, 66 T, 52, 58, 50 R

[56] References Cited

U.S. PATENT DOCUMENTS

| 153,732 | 8/1874 | Watson | 96/34 |
|---|---|---|---|
| 3,223,525 | 12/1965 | Jonker et al. | 96/48 PD |
| 3,369,894 | 2/1968 | Yu | 96/34 |
| 3,562,005 | 2/1971 | De Angelo et al. | 96/48 PD |
| 3,664,837 | 5/1972 | Stanley | 96/34 |
| 3,695,879 | 10/1972 | Laming et al. | 96/48 |
| 3,822,127 | 7/1974 | Tsuboi et al. | 96/48 PD |
| 3,822,128 | 7/1974 | Wainer et al. | 96/48 PD |

FOREIGN PATENT DOCUMENTS

| 896,573 | 5/1962 | United Kingdom | 96/34 |

*Primary Examiner*—Mary F. Kelley
*Attorney, Agent, or Firm*—Sughrue, Rothwell, Mion, Zinn and Macpeak

[57] ABSTRACT

A method for producing a heat resistant, light resistant, chemically resistant and abrasion resistant noble metal image comprising forming a silver image on a photographic material which comprises a substrate having thereon at least one silver halide emulsion layer, either directly or on at least one subbing layer on the substrate, by exposing and developing the photographic material, converting the silver image into a nobel metal image by contacting the silver image with a compound containing a noble metal having an ionization tendency smaller than the ionization tendency of silver, and then heating the photographic material in an oxygen-containing gas to thermally decompose and substantially remove the organic components on the substrate.

17 Claims, No Drawings

NOBLE METAL IMAGE FORMING METHOD

BACKGROUND OF THE INVENTION

1. Field of the Invention

The present invention relates to a method for producing an image which is stable to heat (heat resistant), stable to actinic light (light resistant), is not chemically reactive (chemically resistant), and is mechanically string (abrasion resistant). More particularly, it relates to a processing for converting a silver image formed in a silver halide photographic emulsion layer into a heat resistant, light resistant, chemically resistant and abrasion resistant binderless noble metal image.

2. Description of the Prior Art

A silver halide photographic emulsion layer is colored due to thermal decomposition of the binder when heated to about 150° to 200° C, therefore, it can not be used for purposes requiring heat resistance.

One of the fields which requires a heat resistant image is "super-microphotography." An image reduced on a 35 mm film from a 9 by 14 inch (23 by 36 cm) size original with a reduction ratio of about 10 is usually called a "microphotograph," and a further reduced image (about 2 by 3 mm) by a factor of about 10 is called a "super-microphotograph." That is, a microphotograph can be considered to be an image reduced by a factor of about 10 and a super-microphotograph to be an image reduced by a factor of about 100.

Since the image size of a super-microphotograph is about 2 by 3 mm or smaller, the enlarging factor is about 100 (10,000 based on area ratio) when a super-microphotograph is projected on a screen to provide the original image size. Consequently, a light intensity of about 10 million lux is necessary on the image surface of the super-microphotograph, if the image projected on a transmission type screen, e.g., with a blackened back surface, must have a light intensity of about 100 lux when the screen has a transmission density of 1. In fact, the super-microphotographic image is illuminated with a light intensity of about 12 to 13 million lux to compensate for the loss of the projection lens.

The temperature of the emulsion layer of a supermicrophotograph increases to several hundred degrees C due to the heat generated by the light absorbed in the emulsion layer, when the super-microphotograph is continuously illuminated with such a strong light. As a result, the binder of the emulsion layer is thermally decomposed and colored to cause the image projected on the screen to be dim and colored. Since the silver image areas absorb light well, the temperature of these areas preferentially increases and the binder in these areas is preferentially decomposed, then the decomposition spreads into the surrounding areas. Decomposition of even the binder at the non-silver image areas proceeds in an accelerated manner, once the binder is slightly colored and light absorption occurs.

It has been discovered previously that when an emulsion layer having a silver image therein is heated to about 400° to 600° C in an oxygen-containing gas, such as air, the black silver image turns to a metallic silver image with a mirror surface. The binder of the emulsion layer turns dark red brown due to thermal decomposition. In a subsequent heating process (hereafter, the heating process is designated "baking") in an oxygen-containing gas, the binder is decomposed into oxide gases (e.g., $CO_2$, $H_2O$, and $SO_2$) and removed and the optical density of the colored binder layer at the non-silver image areas gradually decreases. Also, the mirror surface of the silver image disappears probably due to the migration of silver particles (probably silver atoms), and at the same time the silver image loses the ability to resolve lines of a thickness of several microns even though the silver image resolves lines of about 1 micron before baking. It may be considered that the silver atoms migrate from their original location to different locations because minute silver crystals are found at the image areas and the periphery of the image areas and because many pinholes and cracks are observed in the silver image. Cracks and pinholes decrease the optical density of the baked silver image. In particular, the optical density of the high density areas is reduced to a great extent providing a partially reversed image. If the baking is continued until the decomposed binder is completely decomposed and removed, the silver image is seriously damaged and can not be used as a super-microphotographic image.

SUMMARY OF THE INVENTION

Therefore, an object of the present invention is to provide a method for producing a heat resistant, light resistant, chemically resistant and abrasion noble metal image having a high resolving power.

Another object of the present invention is to provide a method for easily producing a chemically resistant substantially pinhole free and inexpensive photomask having good edge acuity.

A further object of the present invention is to provide a method for easily and inexpensively producing a heat resistant, chemically resistant and abrasion resistant noble metal printed circuit and circuit element, such as a capacitor and a resistor.

A still further object of the present invention is to provide a method for producing a heat resistant, light resistant, chemically resistant and abrasion resistant reflection hologram stable for a long time and having a quite high diffraction efficiency.

A further object of the present invention is to provide a method for producing a heat resistant, light resistant, chemically resistant and abrasion resistant permanent photographic image.

The above-described of the present invention are attained by exposing and developing an exposed photographic material which comprises a substrate having thereon at least one silver halide emulsion layer, either directly or on at least one subbing layer on the substrate, to form a silver image, converting the silver image into a noble metal image by contacting the silver image with a compound containing a noble metal having an ionization tendency smaller than the ionization tendency of silver, and then heating the photographic material in an oxygen-containing gas to thermally decompose and substantially remove the organic components on the substrate.

DETAILED DESCRIPTION OF THE INVENTION

Quite surprisingly it has been discovered in this invention that if the silver image is converted into an image of a metal more noble than silver (i.e., a metal having an ionization tendency smaller than that of silver, which metal is hereafter designated as a "noble-metal") and then baked, the mirror surface of the image is maintained until the decomposed binder is completely removed, and the resolving power of the image is not reduced at all. The heat resistivity of the thus obtained noble metal image is so high that the image on a glass plate does not change when heated to the softening point of the glass. Also, since there is no binder at the non-image areas, the non-image areas do not change either.

It has been found that the above-described nobemetallization process not only renders the silver image in the emulsion layer heat resistant but also provides the following additional advantages. That is, the thickness of a silver halide emulsion layer is in general several microns which is on the order of the depth of focus of the projection lens system, therefore, the focussing is difficult. However, since the thickness of the noble metal image of the present invention is a fraction of a micron, such a problem does not occur. Furthermore, the optical density of the silver image formed in the emulsion layer gradually decreases from its maximum value to a background value at the edge of the silver image, that is, edge acuity is not good. However, edge acuity is improved by a reduction in thickness of the image.

The noble-metallization process of the present invention can be applied to the production of a photomask for use in microelectronic fabrication. The widely used emulsion mask has poor abrasion resistance and chemical resistance. Therefore, the emulsion mask can not be cleaned using a strong acid or alkali, when the mask is stained or soiled. Furthermore, since the silver image of the emulsion mask does not transmit visible light, mask alignment is difficult. A hard mask, which is also widely used similar to the emulsion mask, is high priced and complicated to produce, and also it is difficult to obtain a mask which is free from pinholes.

However, according to the present invention an abrasion resistant and chemically resistant noble metal mask can be obtained. The edge acuity of the noble metal mask is better than that of the emulsion mask, since the thickness of the noble metal mask is only a fraction of a micron. Also, less pinholes are present in the noble metal mask than in the prior art hard mask, and it can be considered that substantially no pinholes are present in the noble metal mask. Hence, it is not necessary to select a pinhole free mask. The noble metal mask of the present invention has an advantage in price over the hard mask, because the noble metal selectively deposits on the silver image of the emulsion mask and the silver image areas are usually much smaller than non-silver image areas, even though the noble metal is expensive. When a noble metal image is produced using a conventional photoetching technique, a considerable amount of noble metal is lost by the etching process. Therefore, the cost of using the noble metal is quite high, even if a part of the noble metal is recovered from the etching solution.

When palladium is used as a noble metal in the present invention, a photomask which is transparent in the visible light region (i.e., about 400 nm to 700 nm) can be obtained.

The noble-metallization process of the present invention can be further applied to production of printed circuits. Heretofore, a period circuit has been produced by using a photoetching process or another method which comprises forming a photopolymer relief image having a noble metal fine powder therein and then baking the image to thermally decompose and remove the photopolymer and leave a noble metal circuit there.

The method of the present invention in comparison with these known methods has an advantage in noble metal economy, since the noble metal selectively deposits on the image areas as described already. The method of the present invention has the additional advantages that the sensitivity and resolving power are higher than those of known methods because the present invention uses a silver halide light-sensitive material. Since the noble metal image obtained by baking has good electroconductivity, it can be used as a printed circuit. Further, a stable thin film capacitor can be produced by preparing noble metal images on both surfaces of a thin insulating substrate. Furthermore, if the amount of the noble metal deposited on the silver image is reduced, the electroconductivity of the noble metal image obtained by baking is reduced, and as a result, it can be used as a stable thin film resistor. Since the resolving power of the noble metal image of the present invention is quite high, these circuit elements and printed circuits can be used for microelectronic fabrication.

The noble-metallization process of the present invention can further be applied to the production of heat resistant and abrasion resistant reflection holograms. An amplitude hologram formed by using a silver halide photographic emulsion exhibits a low diffraction efficiency, and the diffraction efficiency of a phase hologram, which is obtained by converting the silver image of an amplitude hologram into a transparent silver compound image, is initially high, but gradually decreases. However, it has been found that a noble metal reflection hologram can be obtained by baking an amplitude silver halide emulsion hologram after converting the silver image into a noble metal image. The thus-obtained reflection hologram is quite stable (light resistant, chemically resistant and heat resistant) and has a fairly diffraction efficiency.

The method of the present invention can be further applied to the production of a heat resistant (fire resistant), chemically resistant (resistant to almost all chemicals), air oxidation resistant, light oxidation resistant and abrasion resistant permanent photographic image.

The photographic material used in the method of the present invention fundamentally comprises a heat resistant substrate having thereon a silver halide emulsion layer. If necessary, at least one subbing layer can be interposed between the substrate and the silver halide emulsion layer.

Suitable heat resistant substrates are glass (e.g., silica glass, borosilicate glass, soda lime glass, barium glass, etc.), sapphire, quartz, heat resistant high melting point polymers such as poly(pyromellitic acid-p-phenylenediamineimide), poly(p-oxybenzoate), poly-(ethylene-2,6-naphthalate), polyamidoimide polymers as described in U.S. Pat. No. 3,554,984, polyimidoimine polymers as described in U.S. Pat. No. 3,472,815, etc.), ceramics (e.g., hard porcelain, soft porcelain, alumina porcelain, titanium porcelain, beryllia porcelain, mullite porcelain, talc porcelain, spinel porcelain, zircon porcelain, ferrite porcelain, earthen ware, glazed and baked earthen ware, etc.), cermet, silica, metals (e.g., iron, copper, zinc, antimony, nickel, cobalt, aluminum, titanium, chromium, tungsten, molybdenum, gold, platinum, palladium, iridium, rhodium, ruthenium, zirconium, tantalum, hafnium, tellurium, a nickel-iron alloy, a nickel-chromium-iron alloy, an aluminum-iron alloy, a chromium-iron alloy, a chromium-aluminum alloy, a silicon-gold alloy, a titanium-aluminum alloy, a copper-beryllium alloy, a cobalt-iron alloy, a cobalt-nickel alloy, a nickel-chromium alloy, etc.), semi-metals, such as silicon, germanium, etc., chalcogen glasses such as As- S-Ge, As-Se-Ge, Ge-S, etc., porcelain enamel, metals coated with ceramics, metals having an oxide layer thereon, carbon fiber, graphite, and the like. A suitable melting point for the heatresistant polymers is about 300° C or higher, preferably 350° C or higher, and a suitable softening point for the heat-resistant polymers is about 200° C or higher, preferably 250° C or higher (Vicat test, ASTM D1525). The thickness of the substrate employed can vary depending on the end-use objects.

The heat resistant substrate of the present invention is in general dimensionally stable before and after baking. However, a high degree of dimensional stability is not always required and such will depend on the end-use of the image. For example, for microelectricfabrication, a high degree of dimensional stability is desired but for supermicrophotography extreme dimensional stability is not required.

The subbing layer to be used in the present invention is a layer which intimately adheres to both the substrate and the silver halide emulsion layer. When the substrate has extremely different properties from the silver halide emulsion layer, two or more subbing layers can be employed. Suitable subbing layers are gelatin, gelatin derivatives, albumin, casein, cellulose, cellulose derivatives, starch, starch derivatives, sodium alginate, polyvinyl alcohol, poly-N-vinyl pyrrolidone, polyacrylic acid copolymers, polyacrylamide, alcohol-soluble polyamide resins as described in Japanese Pat. Publication No. 5,509/64, a mixture of a cellulose ester and a terephthalic acidglycol polyester as described in Japanese Pat. Publication No. 14,503,68, a mixture of gelatin and nitrocellulose as described in Japanese Pat. Publication No. 2,597,/69, compounds as described in Japanese Pat. Publication No. 11,616,/71, a homopolymer or copolyer of glycidyl (meth)acrylate as described in West German Pat. application (OLS) No. 2,001,727, etc. Also, a subbing layer formed by providing a thin polyvinyl acetate layer (for example, a thickness of about 0.1 to 0.3 $\mu$) and contacting the surface with an alkaline aqueous solution, such as an aqueous solution of sodium hydroxide, for saponification can be used. A suitable thickness for the subbing layer can range from about 0.1 to 1.0 $\mu$.

The silver halide emulsion to be used in the present invention can be obtained by dispersing silver halide in a hydrophilic colloid as a binder. Illustrative silver halides are silver chloride, silver bromide, silver iodide, silver chlorobromide, silver bromoiodide, silver chlorobromoidide, etc. The most typical silver halide emulsion is an emulsion which contains about 90 mol % or more silver bromide (preferably containing not more than about 5 mol % silver iodide) and contains silver halide grains or a mean grain size of not more than about 0.1 $\mu$ (a so-called Lippmann emulsion), and in which the weight ratio of the silver halide to the hydrophilic colloid is about 1:4 to about 6:1. Another example of a silver halide emulsion is an emulsion which contains about 50 mol % or more (preferably 70 mol %) silver chloride and contains silver halide grains of a mean grain size of not more than about 1.0 $\mu$.

Examples of suitable hydrophilic colloids which can be used as binders include, e.g., gelatin (alkali treated gelatin, acid treated gelatin, enzyme treated gelatin), colloidal albumin, casein, cellulose derivatives (e.g., carboxymethyl cellulose, hydroxyethyl cellulose, etc.), saccharide derivatives (e.g., agar-agar, sodium alginate, starch derivatives, etc.), synthetic hydrophilic colloids (e.g., polyvinyl alcohol, poly-N-vinyl pyrrolidone, polyacrylic acid copolymers, polyacrylamide, derivatives thereof, etc.). If desired, a compatible mixture of two or more of these hydrophilic colloids can be used. Of these, the most preferred binder is gelatin which can be replaced, partly or completely, by a synthetic high molecular weight material, by a so-called gelatin derivative (prepared by processing gelatin with a compound having a group capable of reacting with the functional groups contained in the gelatin molecule (i.e., amino groups, imino groups, hydroxy groups of carboxy groups), or by a graft polymer prepared by grafting a polymer chain of another high molecular weight substance. Suitable compounds for preparing gelatin derivatives are isocyanates, acid chlorides and acid anhydrides as described in U.S. Pat. No. 2,614,928, acid anhydrides as described in U.S. Pat. No. 3,118,766, bromoacetic acids as described in Japanese Pat. No. 5,514/64, phenyl glycidyl ether as described in Japanese Pat. No. 21,845/67, vinyl sulfone compounds as described in U.S. Pat. No. 3,132,945, N-allylvinyl-sulfonamides as described in British Pat. No. 861,414, maleinimide compounds as described in U.S. Pat. No. 3,186,846, acrylonitriles as described in U.S. Pat. No. 2,594,293, polyalkylene oxides as described in U.S. Pat. No. 3,312,553, epoxy compounds as described in Japanese Pat. No. 26,845,/67, acid esters as described in U.S. Pat. No. 2,763,639, alkanesultones as described in British Pat. No. 1,033,189, etc. Descriptions of suitable high polymer chains to be grafted on gelatin are given in U.S. Pat. Nos. 2,763,625, 2,831,767, 2,966,884, POLYMER LETTERS, 5, 595 (1967), *Phot. Sci. Eng.*, 9, 148 (1965), *J. Polymer Sci.* A-1, 9, 3199 (1971), and the like. Homopolymers or copolymers of compounds which are generally called vinyl monomers, such as acrylic acid, methacrylic acid, the ester, amide, and nitrile derivatives thereof, styrene, etc., are widely used. Hydrophilic vinyl polymers having some degree of compatibility with gelatin, such as homopolymers or copolymers of acrylic acid, acrylamide, methacrylamide, hydroxyalkyl acrylates, hydroxyalkyl methacrylates, etc., are particularly preferred.

These silver halide emulsions are advantageously optically sensitized with known optical sensitizers such as the cyanine dyes and merocyanine dyes as described in U.S. Pat. Nos. 1,346,301, 1,846,302, 1,942,854, 1,990,507, 2,493,747, 2,739,964, 2,493,748, 2,503,776, 2,519,001, 2,666,761, 2,743,900, 2,739,149, and British Pat. No. 450,958.

The silver halide emulsion can be suitable exposed with electromagnetic radiation to which the silver halide emulsion is sensitive, e.g., visible light, ultraviolet light, electron beams, X-rays, etc. With optically sensitized photographic light-sensitive materials, light mainly having a wavelength corresponding to the optically sensitized region of the emulsion can be conveniently selected as the light for exposing the emulsion layer.

The emulsion is advantageously chemically sensitized with salts of noble metals such as ruthenium, rhodium, palladium, iridium, platinum, etc., as described in U.S. Pat. Nos. 2,448,060, 2,566,245, 2,566,263. Also, the emulsion can be chemically sensitized with a gold salt as described in U.S. Pat. No. 2,339,083. The emulsion can be stabilized with a gold salt as described in U.S. Pat. Nos. 2,597,856, 2,597,915. Furthermore, a thio-polymer as described in U.S. Pat. No. 3,046,129 ca advantageously be incorporated in the emulsion. In addition, the emulsion can be stabilized with mercury compounds as described in U.S. Pat. No. 3,046,129, column 20, line 51 to colume 21 line 3, triazoles, azaindenes, disulfides, quaternary benzothiazolium compounds, zinc salts and cadmium salts.

The emulsion can contain light-absorbing dyes as described in U.S. Pat. Nos. 2,527,583, 2,611,696, 3,247,127, 3,260,601, etc.

The emulsion is advantageously hardened with a suitable hardening agent for hydrophilic colloids, such as formaldehyde or a like hardener; N-methylol compounds as described in U.S. Pat. Nos. 2,732,316 and 2,586,168; carbodiimide compounds as described in U.S. Pat. No. 3,091,537; halogen-substituted fatty acids (e.g., mucochloric acid, mucobromic acid, etc.); compounds containing many acid anhydride groups; methanesulfonic acid bisester; dialdehydes or the sodium bisulfate adducts thereof such as $\beta$-methylglutaraldehyde bissodium bisulfite; bisaziridinecarboxyamides (e.g., trimethylenebis(1-aziridinecarboxyamide); triazine derivatives (e.g., 2-hydroxy-4,6-dichloro-s-triazine, etc.); and the like.

The silver halide emulsion is coated on a substrate or after adding a coating aid as described in U.S. Pat. No. 3,046,129. The silver halide emulsion layer preferably has a thickness of about 0.3 $\mu$ to 10 $\mu$ and can be coated in one or more layers on one or both surfaces of the substrate. The thickness of the emulsion layer can suitably be selected depending upon the end-use. A suitable coating amount of the silver halide ranges from about 0.01 to about 50 g (as silver) per m$^2$ of the substrate.

If desired, a backing layer, an antihalation layer, an interlayer, an uppermost layer (e.g., a protective layer, etc.), and the like can be provided on the substrate, or on the emulsion layer.

Formation of a silver image in the silver halide emulsion layer can be effected using conventional photographic processings, that is, by development-processing the exposed emulsion layer and, if necessary, fixing. Conventional photographic processings including exposure, development, fixing, etc., which can be used are described in detail in "Techniques of Microphotography," *Kodak Data Book P*-52, Eastman Kodak Co., Rochester, N. Y.

Developing agents, which can be used in the method of the present invention for forming silver images, are those well known in the art, and include developing agents such as the dihydroxybenzenes (e.g., hydroquinone, 2-chlorohydroquinone, 2-bromohydroquinone, 2-isopropylhydroquinone, toluhydroquinone, 2-phenylhydroquinone, 2,3-dichlorohydroquinone, 2,5-dimethyl-hydroquinone, pyrogallol, etc.); the 3-pyrazolidones (e.g., 1-phenyl-3-pyrazolidone, 1-phenyl-4-methyl-3-pyrazolidone, 1-phenyl-4,4-dimethyl-3-pyrazolidone, 1-phenyl-4-ethyl-3-pyrazolidone, 1-phenyl-5-methyl-3-pyrazolidone, etc.); the aminophenols (e.g., o-aminophenol, p-aminophenol, o-(methylamino)-phenol, p-(methylamino)phenol, p-(diethylamino)phenol, 2,4-diaminophenol, p-(benzylamino)phenol, etc.); ascorbic acid; the 1-aryl-3-aminopyrazolines (e.g., 1-(p-hydroxyphenyl)-3-aminopyrazoline, 1-(p-methylaminophenyl)-3-pyrazoline, 1-(p-aminophenyl)-3-pyrazoline, 1-(p-amino-m-methylphenyl)-3-aminopyrazoline, etc.); N-(p-hydroxyphenyl)glycine; the compounds described as developing agents in C.E.K. Mees & T.H. James, *The Theory of the Photographic Process*, 3rd Edition, Chapter 13, Macmillan Co., New York (1966), L.F.A. Mason, *Photographic Processing Chemistry*, pp. 16 – 30, The Focal Press, London (1966), and the mixtures thereof.

The developer generally has a pH of not less than about 8, preferably about 8.5 to 12.5.

The developer can contain, if desired, an alkali agent (e.g., an alkali metal or ammonium hydroxide, carbonate, borate, etc.), a pH adjusting agent or buffer (e.g., a weak acid or base such as acetic acid, boric acid, a salt thereof, etc.), a development promoting agent (e.g., pyridinium compounds and the cationic compounds as described in U.S. Pat. Nos. 2,648,604 and 3,671,247, potassium nitrate, sodium nitrate, condensation products of polyethyleneglycol and the derivatives thereof as described in U.S. Pat. Nos. 2,533,990, 2,577,127, 2,950,970, nonionic compounds such as polythioethers represented by the compounds as described in British Pat. Nos. 1,020,033 and 1,020,032, pyridine, organic amines such as ethanolamine, benzyl alcohol, hydrazines, etc.), an antifogging agent (e.g., an alkali metal bromide, an alkali metal iodide, nitrobenzimidazoles as described in U.S. Pat. No. 2,496,940 and mercaptobenzimidazole, 5-methylbenztriazole, 1-phenyl-5-mercaptotetrazole, compounds for a rapid developing processing as described in U.S. Pat. Nos. 3,113,864, 3,342,596, 3,295,976, 3,615,522, 3,597,199, thiosulfonyl compound as described in British Pat. No. 972,211, phenazine-N-oxides as described in Japanese Pat. No. 41,675/71, antifogging agents as described in *Handbook of Scientific Photography*, Vol. 2, pp. 29 – 47, Maruzen, Tokyo (1959), etc.), stain or sludge preventing agents as described in U.S. pat. Nos. 3,161,513 and 3,161,514, British Pat. Nos. 1,030,442, 1,144,481, 1,251,558, a preservative (e.g., a sulfite, a bisulfite, hydroxylamine hydrochloride, formaldehyde-sulfite adducts, ethanolaminesulfite adducts, etc.), a surface active agent, etc.

Suitable fixing agents for silver halides are the generally well known solvents for silver halide, such as a water-soluble thiosulfate, (e.g., potassium thiosulfate, sodium thiosulfate, ammonium thiosulfate, etc.), a water-soluble thiocyanate (e.g., potassium thiocyanate, sodium thiocyanate, ammonium thiocyanate, etc.), a water-soluble organic diol (e.g., 3-thia-1,5-pentanediol, 3,6-dithia-1,8-octanediol, 3,6,9-trithia-1,11-undecanediol, 3,6,9,12-tetrathia-1,14-tetradecanediol, etc.), a water-soluble sulfur-containing organic dibasic acid (e.g., ethylenebisthioglycolic acid, etc.), a water-soluble salt thereof (e.g., potassium ethylenebisthioglycolate, sodium ethylenebisthioglycolate, etc.), and a mixture thereof.

The fixing solution can contain, if desired, a preservative (e.g., a sulfite, a bisulfite, etc.), a pH-buffer (e.g., boric acid, a borate, etc.), a pH-adjusting agent (e.g., acetic acid, etc.), a chelating agent, and the like.

Thus, a silver image is formed in the exposed areas. In the unexposed areas, silver halide is removed through fixation. while the binder in the silver halide emulsion layer in these areas remains intact. Where a silver halide emulsion is a reversal-type emulsion or where reversal processing is conducted, the binder layer remains in the exposed areas, whereas a silver image is formed in the unexposed areas.

The silver image is then treated with a solution containing noble metal ions (hereafter, this solution is designated a "toning solution"). By this treatment the silver image is converted into a noble metal image, and at the same time silver ions or a silver compound is formed.

The noble metals which can be used in the present invention are gold, platinum, palladium, rhodium, iridium, and ruthenium. A salt, a complex, an oxygen acid, a salt of an oxygen acid, a complex acid, a salt of a complex acid of the noble metal (hereafter, these compounds, for simplicity, will be designated "noble metal compounds"), or a mixture thereof is dissolved in the toning solution. The solubility of the noble metal compound in the toning solution which is an aqueous solution is not critical. That is, since the concentration of the noble metal compound in the toning solution can range from about 0.01 wt % to a saturated solution, preferably from 0.05 wt % to a saturated solution, the noble metal compound having a small solubility can be used unless it has an extremely small solubility. Even if a saturated toning solution containing an unsolved noble metal compound having a small solubility is used, the undissolved noble metal compound is dissolved and provides a noble metal as the replacement of the silver image with the noble metal proceeds. Further, when the solubility of the noble metal is small, an acid, a base, a salt, a compound capable of forming a complex, or a mixture thereof can be used to increase the solubility.

Examples of noble metal compounds which can be used in the present invention are the halides, halo-acids, salts thereof, cyanides, cyano-complex acids, salts thereof, thiocyanatocomplex acids, salts thereof, oxygen acids, salts thereof, sulfates, nitrates, double salts such as an alum, an ammine complex, an organic ammine complex, an aquo-complex, and the like. Some specific examples are listed in the following, however, the present invention is not to be construed as being limited to only those compounds. In addition, compounds are listed omitting the water crystallization optical isomers.

Typical halides of the noble metals include auric (III) chloride, gold (I)-gold (III) chloride, platinum (II) chloride, palladium (II) chloride, rhodium (III) chloride, iridium (III) chloride, iridium (IV) chloride, ruthenium (III) chloride, gold (III) bromide, platinum (III) bromide, platinum (IV) bromide, palladium (II) bromide, rhodium (III) bromide, ruthenium (III) bromide, platinum (IV) iodide, iridium (III) iodide, etc. Typical halo-acids of the noble metals include chloroauric (III) acid, chloroplatinic (IV) acid, chloropalladic (IV) acid, chloroiridic (IV) acid, bromoauric (III) acid, bromoplatinic (IV) acid, etc. Typical halo-acid salts of the noble metals include the lithium salt, the sodium salt, the potassium salt, or the ammonium salt of tetrachloroauric (III) acid (H[AuCl$_4$]), the lithium salt, the sodium salt, the potassium salt, or the ammonium salt of hexachloroplatinic (IV) acid (H$_2$[PtCl$_6$]), the sodium salt, the potassium salt, the ammonium salt, or the cesium salt of tetrachloroplatinic (II) acid (H$_2$[PtCl$_4$]), the potassium salt or the magnesium salt of hexachloropalladic (IV) acid (H$_2$[P d Cl$_6$]), the sodium salt, the potassium salt, the ammonium salt, or the magnesium salt of tetrachloropalladic (II) acid (H$_2$[PdCl$_4$]), the lithium salt, the sodium salt, the potassium salt, the ammonium salt, or the dimethylammonium salt of hexachlororhodic (III) acid (H$_3$[RhCl$_6$]), the potassium salt of pentachlororhodic (III) acid (H$_2$[RhCl$_5$]), the lithium salt, the sodium salt, or the potassium salt of hexachloroiridic (III) acid (H$_3$[IrCl$_6$]), the lithium salt, the sodium salt, the potassium salt, or the ammonium salt of hexachloroiridic (IV) acid (H$_2$[IrCl$_6$]), the sodium salt, the potassium salt, or the ammonium salt of hexachlororuthenic (III) acid (H$_3$[RuCl$_6$]), the sodium salt, the potassium salt, or the ammonium salt of hexachlororuthenic (IV) acid (H$_2$[RuCl$_6$]), the sodium salt, the potassium salt, the ammonium salt, the dimethylammonium salt, or the tetramethylammonium salt of pentachlororuthenic (III) acid (H$_2$[RuCl$_5$]), the sodium salt, the potassium salt, the rubidium salt, or the ammonium salt of tetrabromoauric (III) acid (H[AuBr$_4$]), the lithium salt, the sodium salt, the potassium salt, or the ammonium salt of hexabromoplatinic (IV) acid (H$_2$[PtBr$_6$]), the sodium salt or the potassium salt of tetrabromoplatinic (II) acid (H$_2$[PtBr$_4$]), the lithium salt, the sodium salt, the potassium salt, the rubidium salt, the cesium salt, or the ammonium salt of hexabromopalladic (IV) acid (H$_2$[PdBr$_6$]), the sodium salt or the potassium salt of tetrabromopalladic (II) acid (H$_2$[PdBr$_4$]), the sodium salt or the pyridinium salt of hexabromorhodic (III) acid (H$_3$[RhBr$_6$]), the sodium salt, the potassium salt, or the ammonium salt of pentabromorhodic (III) acid (H$_2$[RhBr$_5$]), the sodium salt or the potassium salt of hexabromoiridic (III) acid (H$_3$[IrBr$_6$]), the sodium salt, the potassium salt, or the ammonium salt of hexabromoiridic (IV) acid (H$_2$[IrBr$_6$]), the sodium salt, the potassium salt, or the ammonium salt of hexabromoruthenic (IV) acid (H$_2$[RuBr$_6$]), the methylammonium salt or the trimethylammonium salt of pentabromoruthenic (III) acid (H$_2$[RuBr$_5$]), etc. Typical cyanides of the noble metals which can be used for the present invention include gold (I) cyanide, gold (III) cyanide, platinum (II) cyanide, palladium (II) cyanide, rhodium (III) cyanide, iridium (III) cyanide, diruthenium pentacyanide, etc. Typical cyano-complex acids and salts thereof of the noble metals which can be used in the method of the present invention include dicyanoaurous (I) acid (H[Au(CN)$_2$]), and the potassium salt or the ammonium salt thereof, tetracyanoauric (III) acid (H[Au(CN)$_4$]), and the sodium salt, the potassium salt, the ammonium salt, or the cobalt salt thereof, tetracyanoplatinic (II) acid (H$_2$[Pt(CN)$_4$]) and the sodium salt, the potassium salt, the sodium-potassium salt, or the barium salt thereof, tetracyanopalladic (II) acid (H$_2$[Pd(CN)$_4$]) and the sodium salt or the potassium salt thereof, hexacyanorhodic (III) acid (H$_3$[Rh(CN)$_6$]), the potassium salt or the sodium salt thereof, and the adduct of one of these and hexamethylenetetramine, hexacyanoiridic (III) acid (H$_3$[Ir(CN)$_6$]), and the sodium salt, potassium salt or the barium salt thereof, hexacyanoruthenic (II) acid (H$_4$[Ru(CN)$_6$]), and the sodium salt, the potassium salt, or the barium salt thereof, etc. Typical thiocyanatocomplex acids and the salts thereof include tetrathiocyanatoauric (III) acid (H[Au(SCN)$_4$]), and the sodium salt, the potassium salt or the ammonium salt thereof, hexathiocyanatoplatinic (IV) acid (H$_2$[Pt(SCN)$_6$]), and the sodium salt, the potassium salt, or the ammonium salt thereof, the sodium salt or the potassium salt of tetrathiocyanatoplatinic (II) acid (H$_2$[Pt(SCN)$_4$]), the sodium salt, the potassium salt, the ammonium salt, or the barium salt of tetrathiocyanatopalladic (II) acid (H$_2$[Pd(SCN)$_4$]), hexathiocyanatorhodic (III) acid (H$_3$[Rh(SCN)$_3$]), and the potassium salt, or the hexaammine cobalt (III) salt thereof, etc. Typical oxygen acids and salts thereof of the noble metals include auric acid, the potassium salt thereof, palladium (II) sulfate, palladium (II) nitrate, rhodium (III) sulfate, rhodium-potassium alum, the sodium salt or the potassium salt of ruthenic acid, etc. Typical ammine complex salts of the noble metals include diammine-gold (I) chloride, diammine-gold (I) bromide, tetraammine-gold (III) triperchlorate, tetraammine-gold (III) trinitrate, tris(tetraammine-gold (III)) perchloratetetrasulfate, hexaammine-platinum (IV) tetrahydroxide, hexaammine-platinum (IV) tetrachloride hexaammine-platinum (IV) tetranitrate, tetraammine-platinum (II) dichloride, tetraammine-platinum (II) dinitrate, triammine-hydroxylammine-platinum (II) dichloride, tetraammine-palladium (II) dinitrate, tetraammine-palladium (II) dihydroxide, tetraammine-palladium (II) dichloride, tetraammine-palladium (II) sulfate, hexaammine-iridium (III) trinitrate, hexaammine-iridium (III) trichloride, hexaammine-iridium (III) tribromide, hexaammine-iridium (III) triiodide, hexaammine-ruthenium (III) trichloride, hexaammine-ruthenium (III) tribromide, bis-(hexaammine-ruthenium(III)) trisulfate, hexaammine-rhodium (III) trinitrate, hexaammine-rhodium (III) trichloride, hexaammine-rhodium (III) tribromide, bis-(hexaamine-erhodium (III))trisulfate, etc. Typical organic ammine complex salts of the noble metals include tetraethylamine-platinum (II) dichloride [Pt($C_2H_5NH_2$)$_4$]Cl$_2$, tetraethylamine-platinum (II) dinitrate, tetraethylamine-platinum (II) disulfate, trisethylenediamine-iridium (III) trinitrate, trisethylenediamine-platinum (IV) tetrachloride, trisethylenediamine-platinum (IV) tetrathiocyanate, trisethylenediamine-rhodium (III) trichloride, trisethylenediamine-rhodium (III) trithiocyanate, trisethylenediamine-rhodium (III) trinitrate, etc. Typical aquo-complex salts of the noble metals include aquo-triammine-platinum (II) dihydroxide, diaquodiammine-platinum (II) sulfate, aquopentaammine-iridium (III) trinitrate, aquopentaammine-iridium (III) trichloride, aquopentaammine-rhodium (III) trinitrate, aquopentaammine-rhodium (III) tribromide, aquopentaammine-ruthenium (III) trinitrate, ethylenediaminepyridineamine-platinum (II) dichloride, dithiocyanato-diammine-platinum (II), trisodium dithiosulfatoaurate (I), etc.

Of these noble metal compounds, a chloride, a bromide, a chlorocomplex acid, a sodium salt of a chlorocomplex acid, a potassium salt of a chlorocomplex acid, and an ammonium salt of a chlorocomplex acid of gold, platinum, palladium, rhodium, or iridium, a bromocomplex acid, a sodium salt of a bromocomplex acid, a potassium salt of a bromocomplex acid and an ammonium salt of a bromocomplex acid of gold or platinum are especially preferred for the process of the present invention, since these compounds are moderately stable, their solubility in water is sufficiently high, they are easily commercially available, and further, they can be easily synthesized.

In the toning solution, the noble metal of the noble metal compound is dissolved in an aqueous medium forming cations of the noble metal or the noble metal complex ions in which ligands are co-ordinated with the noble metal cations. When the noble metal cations or the noble metal complex ions are contacted with the silver image in the aqueous medium, the image bearing silver is oxidized to silver ion and dissolved into the aqueous medium or forms a water-insoluble silver compound, whereas the noble metal deposits on the silver image areas from the aqueous medium forming a noble metal image. That is, the effect of the toning solution containing the noble metal cations is substantially equal to that containing noble metal complex ions. Therefore, a wide selection of noble metals which can be used for the method of the present invention is possible depending on the treating time and temperature.

The toning solution containing the noble metal compound can contain, if desired, a preservative, a pH-adjusting agent, a surface active agent, and the like.

The silver image is immersed in the toning solution for about 1 minute to about 20 to 30 minutes, and the noble metal is deposited at the silver image areas. The temperature of the toning solution employed is not particularly limited and can be varied as desired. At the same time the image bearing silver dissolves into the toning solution or forms a water-insoluble silver compound at the silver image areas. When a water-insoluble silver compound is formed, it can be dissolved away using a solvent for silver compounds, of which a fixing solution for a silver halide photographic material is representative, or it can again be reduced to silver using a developer for a silver halide photographic material or a general reducing agent, and then the reduced silver image can again be treated using the toning solution, e.g., using the processing procedures and parameters hereinbefore described for the single toning treatment. With this two-fold toning treatment, the amount of the noble metal formed is doubled. Further, the silver compound formed by the toning treatment can be left intact to form a mixed image of the noble metal and the silver compound, or can be reduced to silver to form a mixed image of the noble metal and silver.

The noble metal image which does not contain silver or a silver compound together therewith is suitable for producing a super-microphotographic image. If silver or a silver compound is present in the noble metal image, the resolving power of the image is reduced when it is baking-processed to decompose and remove the organic components including the binder of the emulsion layer on the substrate. However, when only the resolving power of a usual microphotographic image is required, silver or a silver compound can be present in the noble metal image.

The silver image need not necessarily be replaced by only one kind of noble metal and can be replaced by two or more different noble metals at the same time or subsequently. For instance, when the toning solution contains gold (III) chloride and palladium (II) chloride, the silver image is replaced by gold and palladium at the same time. Alternatively, after the silver image is treated with an aqueous solution of gold (III) chloride to form a mixed image of gold and silver chloride, the silver chloride is reduced to silver to form a mixed image of silver and gold, and then the reduced silver image is treated with an aqueous solution of palladium (II) chloride to form a mixed image of palladium and silver chloride (including also the gold previously produced as well), thus the original silver image is converted to a gold and palladium image.

After the toning treatment, the photographic material is rinsed in water and dried, and then baking-processed. Baking is effected by heating in an oxygen containing gas to decompose and remove the binder of the emulsion layer, other layers and the other organic materials present to leave a heat resistant, abrasion resistant, chemically resistant, air oxidation resistant, light resistant and moisture resistant noble metal image on the substrate. Oxygen is necessary to thermally decompose the organic materials including the binder present on the substrate. That is, since the binder and other organic components present are organic materials and comprise carbon, hydrogen, oxygen, nitrogen, sulfur, etc., the decomposition thereof requires oxygen for forming gaseous oxides such as $CO_2$, $NO_2$, $H_2O$, $SO_2$ and the like. Any oxygen containing gas can be used such as a mixture of argon and oxygen, a mixture of nitrogen and oxygen, a mixture of hydrogen and oxygen, a mixture of carbon dioxide and oxygen, a mixture of air and oxygen, air, oxygen alone, etc. Of these, the most convenient oxygen-containing gas is air. When baking is conducted in a vacuum or an inert gas, the binder and other organic materials ar not removed even though they are decomposed. However, decomposition and removal can proceed in the presence of oxygen. The decomposition point differs depending upon the kind of binder used and other organic components present. For example, alkali treated gelatin begins to decompose at a temperature of about 150° C to 200° C, and turns yellow or brown. By baking at a higher temperature the binder turns dark red. The decomposed binder and other organic components present at the non-image areas are completely removed and the substrate surface is uncovered there by baking the photographic material in air at a temperature ranging from about 400° C to 600° C for about 2 or 3 minutes to about 40 or 50 minutes. The removal rate of the decomposed organic material, e.g., binder, at the image areas is somewhat smaller than that at the non-image areas, probably because removal at the image areas is interfered with by the noble metal grains. By subsequent baking which usually takes about 3 minutes to about 10 minutes after the decomposed binder and other organic materials at the non-image areas are completely removed, the decomposed binder and other organic materials at the image areas are also completely removed leaving only the noble metal image on the substrate.

The baking time mainly depends on the baking temperature and the thickness of the layer or layers. The higher the baking temperature is and the smaller the thickness of the emulsion layer is, the shorter the baking time is. A suitable baking temperature is not less than about 200° C, more preferably not less than 350° C, and the upper limit depends on the softening point of the substrate or the noble metal image. When the substrate is an ordinary glass (e.g., soda lime glass), quartz, or sapphire, the upper limit is about 600° C, 1400° C, or 1500° C, respectively. The temperature employed can be just slightly lower than the softening point of the noble metal.

In addition, the noble metal image obtained by the method of the present invention can also be a nucleus for chemical plating. Hence copper, nickel, silver or other metals can be chemically plated on the noble metal image to increase its optical density or to produce a printed circuit, e.g., as described in U.S. Pat. Nos. 3,006,819 and 3,779,758. For both of the objects described immediately above, the image density of the original silver image can be so small that the image can not be seen with the human eyes.

The toning process of the present invention also can be conducted after developing and before fixing of the photographic material. That is, the photographic material is imagewise-exposed and developed, and then the developed silver image is toning-processed, finally the silver halide at the non-image areas and silver compound at the image areas are removed by the fixing solution to form the noble metal image. The process described immediately above omits one fixing process and is practically important.

The following examples are given to illustrate the invention in greater detail. Unless otherwise indicated, all parts, percents, ratios and the like are by weight.

EXAMPLE 1

1400 ml of a silver bromide emulsion (mean grain size of silver bromide: about 0.6 $\mu$) was prepared using 50 g of gelatin and 188 g of silver bromide. To this emulsion was added 0.25 g of 4-methyl-2,3-diethoxathiazocarbocyanine iodide to optically sensitize the emulsion to light of a wavelength of 510 m$\mu$ - 530 m$\mu$. Then, the emulsion was coated to obtain a dry thickness of about 6 $\mu$ on a soda lime glass plate, and then dried to obtain a light-sensitive photographic material. This photographic material was imagewise exposed and developed in a developer having the following composition (24° C, 5 min), followed by fixing in a fixing solution having the following composition (24° C, 1 min) to obtain a silver image.

| Developer | | |
|---|---|---|
| 1-Phenyl-3-pyrazolidone | 0.5 | g |
| Sodium Sulfite | 50 | g |
| Hydroquinone | 12 | g |
| Sodium Carbonate (monohydrate) | 60 | g |
| Potassium Bromide | 2 | g |
| Benzotriazole | 0.2 | g |
| 1-Phenyl-5-mercaptotetrazole | 5 | ml |
| Phenazine-2-carboxylic Acid | 1 | g |
| Water to make | 1 | l |

| Fixing Solution | | |
|---|---|---|
| Ammonium Thiosulfate (70% aq. soln.) | 200 | ml |
| Sodium Sulfite | 15 | g |
| Boric Acid | 8 | g |
| Glacial Acetic Acid | 16 | ml |
| Aluminum Sulfate | 10 | g |
| Sulfuric Acid | 2 | ml |
| Water to make | 1 | l |

After rinsing in water, the photographic material was immersed in an aqueous solution of palladium (II) chloride at a concentration of 0.3% by weight for 5 minutes. After rinsing in water, the photographic material was immersed in the above fixing solution for 2 minutes to remove the silver chloride formed by the toning process and to obtain a palladium image.

After rinsing in water and drying, the photographic material was heated in air for 15 minutes at 500° C, and gelatin at the non-image areas was completely removed, whereas at the image areas a small amount of decomposed gelatin remained. The transmission optical density at the image areas was more than 4 in the visible light region. By subsequent heating for 10 minutes at 500° C, the remaining decomposed gelatin at the image areas was completely removed leaving a binderless palladium image on the substrate.

The thus-obtained palladium image was semi-transparent and the transmitted light was reddish. The image quality was excellent. That is, the image resolved 1 $\mu$ lines very well, the image contrast was higher than that of the original silver image, and the edge sharpness was better than that of the original silver image. No change was observed in the palladium image when it was heated to 600° C.

EXAMPLE 2

The same procedures as described in Example 1 were conducted except that an aqueous solution of chloroauric (III) acid at a concentration of 0.25% by weight was used instead of the aqueous solution of palladium.

The thus-obtained gold image exhibited a glossy metallic surface and the transmitted light of the image was slightly blueish. The image resolved 1 $\mu$ lines quite well.

EXAMPLE 3

The same procedures as described in Example 1 were repeated except an aqueous solution of rhodium (III) chloride at a concentration of 0.4% by weight was used instead of the aqueous solution of palladium and the baking time was shortened to about 5 minutes.

The thus-obtained rhodium image exhibited a glossy metallic surface, and the color of the transmitted light of the image was gray. The image resolved 1 $\mu$ lines very well.

EXAMPLE 4

The same procedures as described in Example 1 were followed except that an aqueous solution of iridium (III) chloride at a concentration of 0.3% by weight was used instead of the aqueous solution of palladium.

The thus-obtained iridium image was white silver colored and the resolving power was somewhat lower than those obtained in the foregoing examples.

EXAMPLE 5

The same procedures as described in Example 1 were conducted except that an aqueous solution of platinum (II) chloride at a concentration of 0.4% by weight was used instead of the aqueous solution of palladium.

The thus-obtained platinum image exhibited a glossy metallic surface and a high resolving power. The image resolved 1 $\mu$ lines quite well.

EXAMPLE 6

The silver image obtained in Example 1 was toning processed using the toning solution as described in Example 2. The silver image was converted to a mixed image of gold and silver chloride. The silver chloride was then reduced to silver using the developer as described in Example 1 to form a mixed image of silver and gold. After rinsing and drying, the photographic material was baking-processed in the same way as described in Example 1.

The thus-obtained binderless metal image was brown and glossless. It did not resolve lines smaller than 4 $\mu$, however, the image was heat resistant.

EXAMPLE 7

The image containing a mixture of silver and gold obtained in Example 6 was treated with an aqueous solution of palladium (II) chloride at a concentration of 0.3% by weight before baking to replace the silver with palladium. The silver chloride formed by this treatment was removed using the fixing solution as described in Example 1. After rinsing and drying, the photographic material was baking-processed as described in Example 1 to form a binderless image of a mixture of gold and palladium.

The thus-obtained metal image had a very high resolving power and resolved 1 $\mu$ lines very well. The image was gray or black colored with a metallic glossy surface, and the color of the transmitted light of the image was neutral.

EXAMPLE 8

The mixed image of palladium and silver chloride obtained in Example 1 was treated with the developer as described in Example 1 to reduce the silver chloride to silver, then the reduced silver image was treated with the palladium toning solution as described in Example 1 to replace the silver image with palladium. The silver chloride formed by the second toning process was removed using the fixing solution as described in Example 1 to form a palladium image. The amount of palladium of the image was almost twice that obtained in Example 1. After rinsing and drying, the photographic material was baking-processed as described in Example 1 to obtain a binderless palladium image.

The thus-obtained palladium image had a transmission optical density larger than that obtained in Example 1, and resolved 1 $\mu$ lines very well.

EXAMPLE 9

The light-sensitive material as described in Example 1 was exposed to an optical image for microelectronic fabrication which had a minimum line width of 2 $\mu$ and an average line width of 10 $\mu$, and then developed to form a silver image as described in Example 1. The photographic material was then toning processed and baking-processed as described in Example 1 to obtain a photomask.

The thus-obtained photomask was semi-transparent (a so-called see-through mask) and convenient for mask alignment. The edge acuity of the mask was better than that of an emulsion mask. Further, since there was no binder, the image was extremely clear and abrasion resistant.

EXAMPLE 10

The emulsion as described in Example 1 was coated on a sapphire plate to obtain a dry thickness of 18 $\mu$. This photographic material was exposed to an optical image having a minimum line width of 50 $\mu$, and then developed and fixed as described in Example 1. The thus-obtained silver image was then toning processed as described in Example 2. After rinsing and drying, the photographic material was heated in air for 40 minutes at 500° C, then 10 minutes at 800° C.

The thus-obtained gold pattern had good electrical conductivity (almost the same conductivity as gold metal).

EXAMPLE 11

The emulsion as described in Example 1 was coated on a steel plate coated with a white ceramic to obtain a dry thickness of 3 $\mu$. Using this photographic material, the same procedures as described in Example 2 were followed.

Thus, a heat resistant and abrasion resistant permanent photograph was obtained.

EXAMPLE 12

The emulsion as described in Example 1 was coated on a glass plate to obtain a dry thickness of 0.4 $\mu$. Using this photographic material, the same procedures as described in Example 1 were followed. The transmission optical density of the original silver image was about 0.3, whereas that of the palladium image was about 0.2.

The palladium image was immersed in a commercially available copper chemical plating solution, and copper was deposited on the palladium image providing a transmission optical density of more than 3.

EXAMPLE 13

The emulsion as described in Example 1 was coated on both sides of a sintered alumina plate of a thickness of 1 mm to obtain a dry thickness of 12 $\mu$. Both emulsion layers were exposed to a different optical pattern, and then processed as described in Example 2 to obtain a gold image. Baking was conducted at 400° C for 1 hour and then at 500° C for 10 minutes.

The thus-obtained gold pattern had good electrical conductivity, and a different circuit pattern was formed on each surface of the substrate.

EXAMPLE 14

The same procedures as described in Example 2 were conducted except for coating a subbing layer having the following composition on the substrate using an immersion method and drying for 15 minutes at 130° C prior to coating the silver halide photographic emulsion.

SUBBING SOLUTION

A solution prepared by adding to a gelatin dispersion comprising:

| | |
|---|---|
| Gelatin | 0.4 g |
| Salicylic Acid | 0.12 g |
| Methanol | 0.18 g |
| Ethylene Chloride | 55.0 g |
| Acetone | 15.0 g |
| 0.45 g of Nitrocellulose (Nitrocellulose RS ½; made by Daisel Ltd.) and 10.0 g of Acetone under stirring. | |

EXAMPLE 15

The photographic material as described in Example 1 was exposed to an optical image and then developed using the developer as described in Example 1 to form a silver image. After rinsing in running water, the silver image was toning processed using the toning solution as described in Example 2. After rinsing in running water, the photographic material was fixed with the fixing solution as described in Example 1. The photographic material was rinsed in water and dried, and then baking-processed in the same way as described in Example 2 to obtain the same results as those obtained in Example 2.

In this example only one fixing process was needed in contrast with the foregoing examples.

While the invention has been described in detail and with reference to specific embodiments thereof, it will be apparent to one skilled in the art that various changes and modifications can be made therein without departing from the spirit and scope thereof.

What is claimed is:

1. A method for producing an image comprising, forming a silver image on a photographic material which comprises a glass substrate having thereon at least one silver halide emulsion layer having a binder comprising at least one material selected from the group consisting of gelatin, colloidal albumin, casein, a cellulose derivative, a saccharide derivative, a synthetic hydrophilic colloid, a modified gelatin, a gelatin derivative, or a synthetic high molecular weight material, either directly or on at least one subbing layer on the substrate, by imagewise exposing and developing said photographic material; replacing said silver image with a noble metal image by contacting said silver image with a toning solution containing a compound containing a noble metal having an ionization tendency smaller than the ionization tendency of silver, said noble metal being selected from the group consisting of gold, platinum, palladium, rhodium, iridium and ruthenium, and then subsequently heating after toning, the photographic material in an oxygen-containing gas to a temperature between about 350° to 600° C for a period sufficient to thermally decompose and substantially remove the organic components on the substrate.

2. The method as described in claim 1, wherein said compound of a noble metal having an ionization tendency smaller than the ionization tendency of silver is at least one compound selected from the group consisting of a chloride; a bromide; a chlorocomplex acid, a sodium salt, a potassium salt or an ammonium salt of a chlorocomplex acid; a bromo-complex acid; and a sodium salt, a potassium salt, or an ammonium salt of a bromo-complex acid.

3. The method as described in claim 1, wherein said aqueous solution contains said compound at a concentration of about 0.01% by weight to a saturated solution.

4. The method as described in claim 3, wherein said aqueous solution contains said compound at a concentration of 0.05% by weight to a saturated solution.

5. The method as described in claim 1, wherein said oxygen-containing gas is air.

6. The method as described in claim 1, wherein said compound of a noble metal having an ionization tendency smaller than the ionization tendency of silver is at least one compound selected from the group consisting of gold (III) chloride; gold (I)-gold (III) chloride; platinum (II) chloride; palladium (II) chloride; rhodium (III) chloride; iridium (III) chloride; iridium (IV) chloride; gold (III) bromide; platinum (III) bromide; platinum (IV) bromide; palladium (II) bromide; rhodium (III) bromide; chloroauric (III) acid; chloroplatinic (IV) acid; chloropalladic (IV) acid; chloroiridic (IV) acid; bromoauric (III) acid; bromoplatinic (IV) acid; the sodium salt, the potassium salt, or the ammonium salt of tetrachloroauric (III) acid; the sodium salt, the potassium salt, or the ammonium salt of hexachloroplatinic (IV) acid; the sodium salt, the potassium salt, or the ammonium salt of tetrachloroplatinic (II) acid; potassium hexachloropalladate (IV); the sodium salt, the potassium salt, or the ammonium salt of tetrachloropalladic (II) acid; the sodium salt, the potassium salt, or the ammonium salt of hexachlororhodic (III) acid; the sodium salt, the potassium salt, or the ammonium salt of hexachloroiridic (III) acid; the sodium salt, the potassium salt, or the ammonium salt of hexachloroiridic (IV) acid; the sodium salt, the potassium salt, or the ammonium salt of tetrabromoauric (III) acid; the sodium salt, the potassium salt, or the ammonium salt of hexabromoplatinic (IV) acid; and the sodium salt or the potassium salt of tetrabromoplatinic (II) acid.

7. The method as described in claim 1, wherein said silver halide is silver chloride, silver bromide, silver iodide, silver chlorobromide, silver bromoiodide, silver chloroiodide, silver chlorobromoiodide or mixtures thereof.

8. The method as described in claim 1, wherein said silver halide emulsion is an emulsion containing about 90 mol % or higher silver bromide and about 5 mol % or less silver iodide and the mean grain size of the silver halide grains is about 0.1 micron or less and wherein the weight ratio of the silver halide to the hydrophilic colloid binder of the emulsion is about 1:4 to 6:1.

9. The method as described in claim 1, wherein said silver halide emulsion is an emulsion which contains about 50 mol % or higher silver chloride and contains silver halide grains having a mean grain size of about 1 micron or smaller.

10. The method as described in claim 1, wherein said silver halide emulsion layer has a thickness of about 20 microns or less.

11. A method for producing an image comprising, forming a silver image on a photographic material which comprises a glass substrate having thereon at least one silver halide emulsion layer having a binder comprising at least one material selected from the group consisting of gelatin, colloidal albumin, casein, a cellulose derivative, a saccharide derivative, a synthetic hydrophilic colloid, a modified gelatin, a gelatin derivative, or a synthetic high molecular weight material, either directly or on at least one subbing layer on the substrate, by (1) imagewise exposing and developing said photographic material, (2) replacing said silver image with a noble metal image by contacting said silver image with a toning solution containing a compound containing a noble metal having an ionization tendency smaller than the ionization tendency of silver to form a mixed image of a silver compound and said noble metal, said noble metal being selected from the group consisting of gold, platinum, palladium, rhodium, iridium and ruthenium, and (3) then subsequently heating after toning the photographic material in an oxygen-containing gas to a temperature between about 350° to 600° C for a period sufficient to thermally decompose and substantially remove the organic components on the substrate.

12. The method as described in claim 11, including removing the silver compound formed by said replacing process prior to said heating process.

13. The method of claim 11, including the further step of reducing the silver compound before said heating, to form a mixed image of silver and said noble metal.

14. The method as described in claim 13, further including replacing the silver portion of said mixed image with a noble metal image by contacting said mixed image with a toning solution containing a compound containing a noble metal selected from the group consisting of gold, platinum, palladium, rhobium, iridium and ruthenium prior to said heating.

15. The method as described in claim 14, wherein the noble metal of said mixed image is different from the noble metal with which the silver portion of said mixed image is replaced.

16. The method as described in claim 14, wherein the noble metal of said mixed image is the same as the noble metal with which the silver portion of said mixed image is replaced.

17. The method as described in claim 14, further including reducing the silver compound formed by replacing the silver portion of the mixed image to form a second mixed image of silver and a noble metal and then replacing the silver portion of said second mixed image with a noble metal image by contacting said mixed image with a toning solution containing a compound containing a noble metal selected from the group consisting of gold, platinum, palladium, rhobium, iridium and ruthenium prior to said heating.

* * * * *